(12) United States Patent
La Tulipe, Jr. et al.

(10) Patent No.: US 8,637,953 B2
(45) Date of Patent: Jan. 28, 2014

(54) WAFER SCALE MEMBRANE FOR THREE-DIMENSIONAL INTEGRATED CIRCUIT DEVICE FABRICATION

(75) Inventors: Douglas C. La Tulipe, Jr., Guilderland, NY (US); Sampath Purushothaman, Yorktown Heights, NY (US); James Vichiconti, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 792 days.

(21) Appl. No.: 12/172,452

(22) Filed: Jul. 14, 2008

(65) Prior Publication Data
US 2010/0006972 A1  Jan. 14, 2010

(51) Int. Cl.
*H01L 21/70* (2006.01)

(52) U.S. Cl.
USPC .................................. 257/499; 257/E27.137

(58) Field of Classification Search
USPC ................... 257/499.777, E27.137, E27.144, 257/E27.161, E21.122; 156/345.51
See application file for complete search history.

(56) References Cited

U.S. PATENT DOCUMENTS

| | | | |
|---|---|---|---|
| 5,024,873 A | 6/1991 | Burack et al. | |
| 5,592,007 A | 1/1997 | Leedy | |
| 5,962,079 A | 10/1999 | Koberstein et al. | |
| 6,599,778 B2 | 7/2003 | Pogge et al. | |
| 6,765,279 B2 | 7/2004 | Leedy | |
| 6,856,025 B2 | 2/2005 | Pogge et al. | |
| 6,864,165 B1 | 3/2005 | Pogge et al. | |
| 7,157,352 B2 | 1/2007 | Yamanaka | |
| 7,166,520 B1 | 1/2007 | Henley | |
| 7,410,884 B2 * | 8/2008 | Ramanathan et al. | 438/455 |
| 2005/0020094 A1 * | 1/2005 | Forbes et al. | 438/784 |
| 2006/0105496 A1 * | 5/2006 | Chen et al. | 438/106 |
| 2007/0262378 A1 * | 11/2007 | Wilson et al. | 257/347 |

* cited by examiner

*Primary Examiner* — Evan Pert
*Assistant Examiner* — Selim Ahmed
(74) *Attorney, Agent, or Firm* — Louis J. Percello; Jeffrey N. Giunta; Fleit Gibbons Gutman Bongini & Bianco PL

(57) ABSTRACT

An fabrication of three-dimensional integrated devices and three-dimensional integrated devices fabricated therefrom are described. A device side of a donor wafer is coated with a polymer film and exposure of a substrate side to an oxidizing plasma creates a continuous $SiO_2$ film. Portions of the substrate side are selectively coated with a polymer film and etching of uncoated areas removes at least a substantial portion of the crystalline substrate. A plasma etch tool etches a crystalline substrate to within a pre-determined thickness. The silicon portions of the substrate side are etched by exposure to TMAH. After etching, the donor semiconductor wafer is supported by portions of the substrate that were not etched. The supporting structure allows flexing of the donor semiconductor wafer within the etched areas to enable conformality and reliable bonding to the device surfaces of an acceptor wafer to form a three dimensional integrated device.

5 Claims, 4 Drawing Sheets

WAFER SCALE MEMBRANE FOR THREE-DIMENSIONAL INTEGRATED CIRCUIT DEVICE FABRICATION

FIELD OF THE INVENTION

The present invention relates generally to silicon circuit devices and fabrication techniques, and more particularly to fabricating three-dimensional integrated circuit devices.

BACKGROUND OF THE INVENTION

The stacking of integrated circuits and discrete devices in three dimensions enables advanced Chip Packaging, CMOS, and mixed CMOS/Photonics/RF technologies and applications. An inability to precisely align structures and bond them to each other with minimum yield impact is a major limitation to three-dimensional integrated circuit fabrication. Many process schemes are employed to transfer devices from one Si wafer and stack them on devices fabricated on another Si wafer. Generally either direct bonding of two Si wafers with the subsequent removal of one (donor) substrate, or a (donor) layer transfer to a disposable "handle" substrate with subsequent bonding and handle substrate removal are methods used for circuit and device level 3D integration. These processes have limitations that induce manufacturing complexity and can reduce yields.

Directly bonding two silicon wafers face to face and selectively grinding and etching one to leave a transferred device layer is an option that does not involve processing of thermally dissimilar materials. In the device or circuit alignment procedure, however, this technique does not allow direct viewing of alignment patterns and through wafer imaging using infrared light is often used to see through each Si wafer during the alignment procedure. Transfer of device layers from donor substrates to transparent "handle" substrates allows direct optical alignment of patterns, but introduces pattern shifts and yield limitations as a result of unmatched thermal characteristics and substrate flatness variations.

Three-dimensional integrated circuit fabrication techniques also often suffer from process induced pattern specific voiding at the bonding surface. Such voiding is often very difficult to control and reduces product yields.

Therefore a need exists to overcome the problems with the prior art as discussed above.

SUMMARY OF THE INVENTION

In accordance with one aspect of the present invention, a method for fabricating three-dimensional integrated circuits includes etching a crystalline substrate within an area of a substrate side of a donor semiconductor wafer, the substrate side having a substrate thickness and being located opposite a device side of the donor semiconductor wafer, to remove at least a substantial portion of the crystalline substrate within the area. The method further including supporting the donor semiconductor wafer with a supporting structure. The supporting structure allowing flexing of the donor semiconductor wafer within at least a portion of the area after the etching.

In accordance with another aspect of the present invention, a three-dimensional integrated circuit fabrication apparatus includes an etching tool adapted to etch crystalline substrate within an area of a substrate side of a donor semiconductor wafer. The substrate side has a substrate thickness and is located opposite a device side of the donor semiconductor wafer. The etching tool removes at least a substantial portion of the crystalline substrate within the area. The three-dimensional integrated circuit fabrication apparatus further includes a supporting structure adapted to support the donor semiconductor wafer. The supporting structure allowing flexing of the donor semiconductor wafer within at least a portion of the area after the etching.

In accordance with another aspect of the present invention, a three-dimensional integrated semiconductor device includes at least a portion of an acceptor wafer comprising a first device layer and at least a portion of a donor wafer with a second device layer bonded to the first device layer. The donor wafer has a crystalline substrate that has been substantially removed from the at least a portion of the donor wafer prior to being bonded to the first device layer, thereby allowing the second device layer to flexibly conform to the first device layer.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
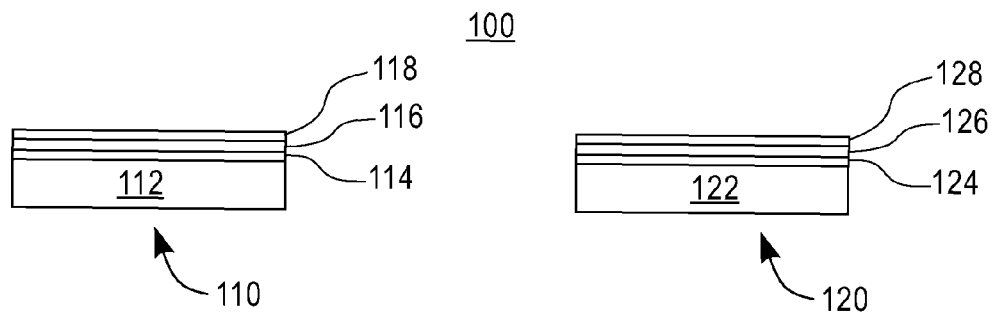
FIG. 1 illustrates a Silicon on Insulator (SOI) semiconductor wafer pair adapted to be fabricated into a three-dimensional semiconductor circuit, in accordance with one embodiment of the present invention.

While the specification concludes with claims defining the features of the invention that are regarded as novel, it is believed that the invention will be better understood from a consideration of the following description in conjunction with the drawing figures, in which like reference numerals are carried forward.

One embodiment of the present invention provides a device transfer option that does not use lamination to a "handle" substrate. An ultra thin (generally less than 1 μm), transparent film that contains electrical devices, such as electronic or opto-electronic circuits is created from a conventional wafer by removing most or all of the bulk substrate. The ultra thin, transparent film facilitates the highest possible bonding alignment accuracy between the two die or wafers by allowing optical sensing of a mating wafer surface through the film. At least a portion of the device side of the ultra-thin transparent film that forms a donor semiconductor wafer is bonded to a device side of an acceptor semiconductor wafer such that the flexing of the donor semiconductor wafer conforms the device side of the donor semiconductor wafer to the device side of the acceptor semiconductor wafer. Once bonded, this ultra-thin, transparent film easily conforms to pattern specific topography of the surface to which it is bonded and allows diffusion of volatile species during a bond anneal cycle. All of which represent yield improvements with respect to conventional device layer transfer options.

One embodiment of the present invention provides a layer transfer technique that creates a thin (usually <10 μm thick and more commonly about 1 μm thick) membrane that is the size of an entire semiconductor wafer. The thin membrane contains semiconductor devices, such as electronic or optoelectronic circuits. This thin membrane in one embodiment is created using a combination of RIE etching and wet etching processes to remove all or selected portions of the crystalline silicon substrate of a semiconductor wafer. This thin membrane is designed and intended to be bonded to another semiconductor die or wafer to create three-dimensional integrated circuit devices.

The thin membrane that contains the desired semiconductor structures is supported by a supporting structure. One embodiment of the present invention uses a ring of full thickness crystalline silicon at the wafer edge that is not etched from the bulk silicon substrate of the wafer. Such a ring of full thickness crystalline silicon in one embodiment is also supplemented by an optional grid of full thickness crystalline silicon that is not etched from the bulk silicon substrate. The supports in such a grid exist between, for example, one or more active device areas on the wafer. Yet another embodiment of the present invention is able to create a membrane that has all of the bulk Silicon substrate removed and that is supported by a support structure that includes a separate attached structural support. One embodiment of the present invention uses, for example, a glass/Pyrex support ring that is attached to the circumference of the membrane before the silicon substrate is etched from the wafer.

FIG. 1 illustrates a Silicon on Insulator (SOI) semiconductor wafer pair 100 adapted to be fabricated into a three-dimensional semiconductor circuit, in accordance with one embodiment of the present invention. The SOI semiconductor wafer pair 100 includes a first SOI semiconductor wafer 110 that is an acceptor semiconductor wafer for a three-dimensional integrated semiconductor device. The SOI semiconductor wafer pair 100 also includes a second SOI semiconductor wafer 120 that is a donor semiconductor wafer for a three-dimensional integrated semiconductor device. The first SOI semiconductor wafer 110 has a first bulk silicon layer 112, a first buried insulator layer 114, and a first device layer 116. The second SOI semiconductor wafer 120 has a second bulk silicon layer 122, a second buried insulator layer 124, and a second device layer 126. The first SOI semiconductor wafer 110 and the second SOI semiconductor wafer 120, including their buried insulator layers and device layers, of one embodiment of the present are fabricated using conventional means.

Although the example illustrated in the Silicon on Insulator (SOI) semiconductor wafer pair 100 of FIG. 1 uses a Silicon on Insulator (SOI) wafer as the acceptor semiconductor wafer, the illustrated embodiment and further embodiments of the present invention are able to operate by using acceptor semiconductor wafers that consist of any type of substrate, such as a bulk silicon wafer, GaAs or other types of substrates, and are not limited to using SOI substrates for either the acceptor semiconductor wafer or the donor semiconductor wafer. Acceptor semiconductor wafers of one embodiment are characterized by having a surface that is suitable for bonding to the donor semiconductor wafer and as being suitable for the bonding process used to bond the donor semiconductor wafer to the acceptor semiconductor wafer.

The first device layer 116 and the second device layer 126 of one embodiment of the present invention include semiconductor circuits that are intended to be fabricated so that the top of the first device layer 116 will be positioned so as to face the second device layer 126.

The first SOI semiconductor wafer 110 further has a first bonding film 118 placed on the first device layer 116 and the second semiconductor wafer 120 has a second bonding film 128 placed on the second device layer 126. As described below, one embodiment of the present invention forms a three-dimensional semiconductor circuit by locating the first SOI semiconductor wafer 110 in proximity to the second SOI semiconductor wafer 120 and bonding the SOI semiconductor wafers together by placing the first bonding film 118 in contact with the second bonding film 128 so as to cause the first device layer 116 to be facing and precisely aligned to the second device layer 118.

Figure 2:
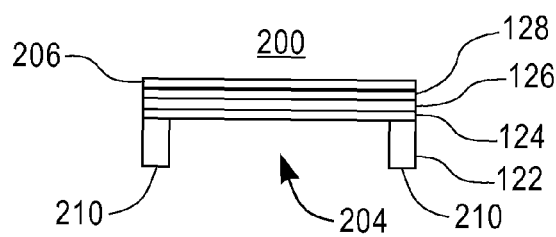
FIG. 2 illustrates a substrate etched second SOI semiconductor wafer, in accordance with one embodiment of the present invention.

FIG. 2 illustrates a substrate etched second SOI semiconductor wafer 200, in accordance with one embodiment of the present invention. The substrate etched second SOI semiconductor wafer 200 of one embodiment corresponds to the second SOI semiconductor wafer 120, described above, after it has been partially processed according to one embodiment of the present invention. The substrate etched second SOI semiconductor wafer 200 of one embodiment is an entire semiconductor wafer, such as a 200 mm silicon wafer or a 300 mm silicon wafer in some embodiments of the present invention.

The substrate etched second SOI semiconductor wafer 200 includes an area that is an etched region 204 in which the bulk silicon substrate has been completely etched to the second buried insulator layer 124 with the exception of a support ring 210. In one embodiment, the support ring 210 is a about one centimeter wide and extends along the entire outer edge of the semiconductor wafer. The etched second SOI semiconductor wafer 200, which corresponds to the second SOI semiconductor wafer 120, includes, within the area, the second buried insulator layer 124 the second device layer 126, and the second bonding film 128.

The second SOI semiconductor wafer 120 of one embodiment is processed to form discrete transistors or circuits to be transferred to the first SOI semiconductor wafer 110 and to be stacked on another layer of devices/circuits. The second SOI wafer 120 of one embodiment is prepared in the usual manner for bonding of its device layer to the device layer of the first SOI semiconductor wafer 110.

Once the first SOI semiconductor wafer 110 and the second SOI semiconductor wafer 120 are prepared, the front side, i.e., the device side, of the second SOI semiconductor wafer 120 is coated with a polymer film 206 that is known to be resistant to caustic, high temperature etch chemistries such as tetramethylammonium hydroxide (TMAH) used in the art for silicon etching. This polymer film in one embodiment is processed per vender specification to ensure optimum performance.

One embodiment of the present invention supports the thin membrane that includes the second device layer 126 and the second buried insulator 128 with a ring 210 of crystalline silicon along the outer edge of the second SOI semiconductor wafer 120. In such embodiments, the backside (i.e., the side opposite the front side or the device side) of the second SOI semiconductor wafer 120 is then coated with polymer material so as to cover an outer annular ring of substrate that is located close to the edge and bevel surface of the second SOI semiconductor wafer 120. This outer annular ring defines a crystalline silicon structure that is to be a support ring 210. In one embodiment, the outer annular ring defining the support ring 210 has a width of about one centimeter. The polymer film that is coated on a part of the backside of the second SOI semiconductor wafer 120 is then annealed per vender specification. Once the polymer film is cured, the backside of the second SOI semiconductor wafer 120 is exposed to oxidizing plasma for several minutes to ensure a continuous native $SiO_2$ film.

Once the substrate is coated in its portions that are not to be etched, the second SOI semiconductor wafer 120 is loaded in a plasma etch tool which is specifically designed to etch crystalline silicon at high rates in a directional, or semi directional manor. In one embodiment, an Alcatel Deep Silicon RIE is used. A reactive gas chemistry containing $SF_6$ and $O_2$ is used in this embodiment to etch the silicon at a rate of >60 μm per hour. The etch chuck in this example is configured in such a way that the clamping ring also protects a part of the polymer coating that covers the annular ring defining the support ring of the second SOI semiconductor wafer 120. The dry etch of one embodiment is timed to stop with about 100-200 μm of silicon wafer remaining within the etching area 204. A further embodiment of the present invention includes a specifically designed wafer clamp mechanism that provides protection of the entire support ring area of the substrate during the dry etching process.

Once the second SOI semiconductor wafer 120 has been thinned substantially, as described above, it is exposed to TMAH at a concentration and temperature known to etch silicon at high rates while being selective to $SiO_2$. Areas that have been protected with the polymer film are unaffected by this etching process. When the crystalline silicon clears and the buried insulation layer 124 of the second SOI semiconductor wafer 120 is exposed, in one embodiment, the second SOI semiconductor wafer 120 is removed from the etch and rinsed with water.

A final preparation step includes removing the protective polymer film either by exposure to an $O_2$ plasma, or alternatively using a conventional organic stripper.

Figure 3:
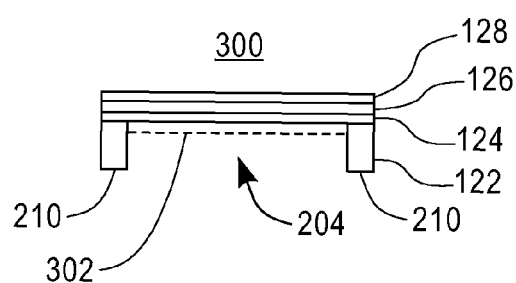
FIG. 3 illustrates an alternative substrate etched second SOI semiconductor wafer, in accordance with one embodiment of the present invention.

FIG. 3 illustrates an alternative substrate etched second SOI semiconductor wafer 300, in accordance with one embodiment of the present invention. The alternative substrate etched second SOI semiconductor wafer 300 is similar to the substrate etched second SOI semiconductor wafer 200 described above, except that the second bulk silicon layer 122 is not completely etched so as to expose the second buried insulator area 124 but rather leaves a silicon layer 302. The silicon substrate of the alternative substrate etched second SOI semiconductor wafer 300 is etched to a depth that leaves a silicon layer 302 that has a predetermined thickness. The predetermined thickness of the silicon layer 302 is able to be selected based upon the intended application for the alternative substrate etched second SOI semiconductor wafer 300.

Figure 4:
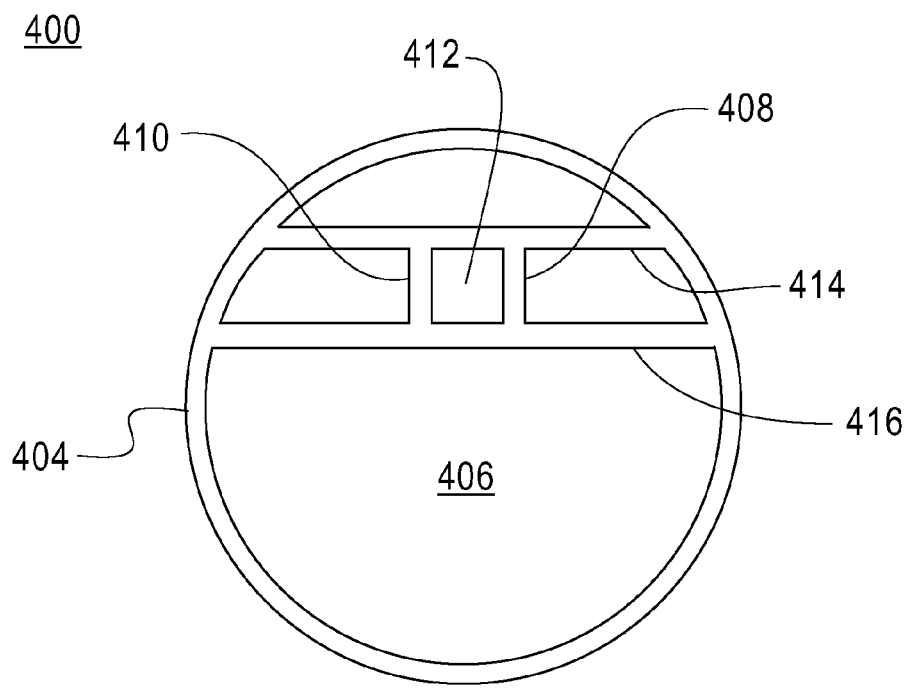
FIG. 4 illustrates a partitioned wafer substrate side of a second SOI semiconductor wafer, in accordance with one embodiment of the present invention.

FIG. 4 illustrates a partitioned wafer substrate side of a second SOI semiconductor wafer 400, in accordance with one embodiment of the present invention. The partitioned wafer substrate side 400 of the second SOI semiconductor wafer 400 shows a silicon substrate support ring 404, that corresponds to support ring 210 described above. In one embodiment of the present invention, the support ring 404 consists of a one centimeter (1 cm) ring of silicon substrate that is not etched by the above described etching process.

In addition to the support ring 404, the partitioned wafer substrate side of a second SOI semiconductor wafer 400 includes additional support partitions that further divide the area of the wafer into a grid with sections consisting of one or more die on the wafer. In the illustrated example, a first cross-support 414 and a second cross-support 416 extend parallel to one another across the wafer from one point of the support ring 404 to a point across the support ring 404. The first cross-support 414 and the second cross-support 416 are aligned with and cover the edges of individual die on the wafer of the partitioned wafer substrate side of a second SOI semiconductor wafer 400.

The partitioned wafer substrate side of a second SOI semiconductor wafer 400 further has a first dividing support 408 and a second dividing support 410 that are parallel to each other and extend perpendicularly between the first cross-support 414 and the second cross-support 416. A selected die 412 is shown to be within the area that is bordered by the first cross-support 414, the second cross-support 416, the first dividing support 408 and the second dividing support 410. As discussed below, one embodiment of the present invention allows for the selective engagement of the selected die 412 when forming three-dimensional integrated circuits.

One embodiment of the present invention creates the additional support partitions by lithographically patterned areas that overlay the chip kerf areas. These areas are protected, for example, by a combination of dielectric film and a TMAH resistant polymer during the above described substrate etching phase.

The additional support partitions of one embodiment create a structure that provides support across the membrane and reduces potential distortions to the membrane. The additional support partitions further allow for individual chips or die to be bonded to portions, such as individual die, of the first SOI semiconductor wafer 110 and selectively removed so as to allow using only known good die on the second SOI semiconductor wafer 110.

One embodiment of the present invention that incorporates additional support partitions on the second SOI semiconductor wafer 120 include a modified membrane holder assembly that allows control the back side pressure within each section that is defined by the additional support partitions. One embodiment of the present invention allows sections that correspond to individual die on the second SOI semiconductor wafer 120 to be defined by additional supports within the second SOI semiconductor wafer 120. Such embodiments allow, for example, selective bonding one die on the second SOI semiconductor wafer 120 to a corresponding die on the first SOI semiconductor wafer 110. The membrane holder of such embodiments is able to have the ability for selective chip level release of the membrane once a bond has been initiated.

Another benefit of defining grids within the second SOI semiconductor wafer 120 by incorporating additional support partitions is that parts or all of the membrane can be transferred to an acceptor substrate, i.e., a wafer corresponding to the first SOI semiconductor wafer 110, that does not have the same form factor as the second SOI semiconductor wafer 120. Examples of such an application includes mixed technology integration when substrate form factors for the different functional elements being combined are fabricated in different size or form factor substrates, such as GaAs lasers, CMOS devices, MEMS devices and the like.

Figure 8:
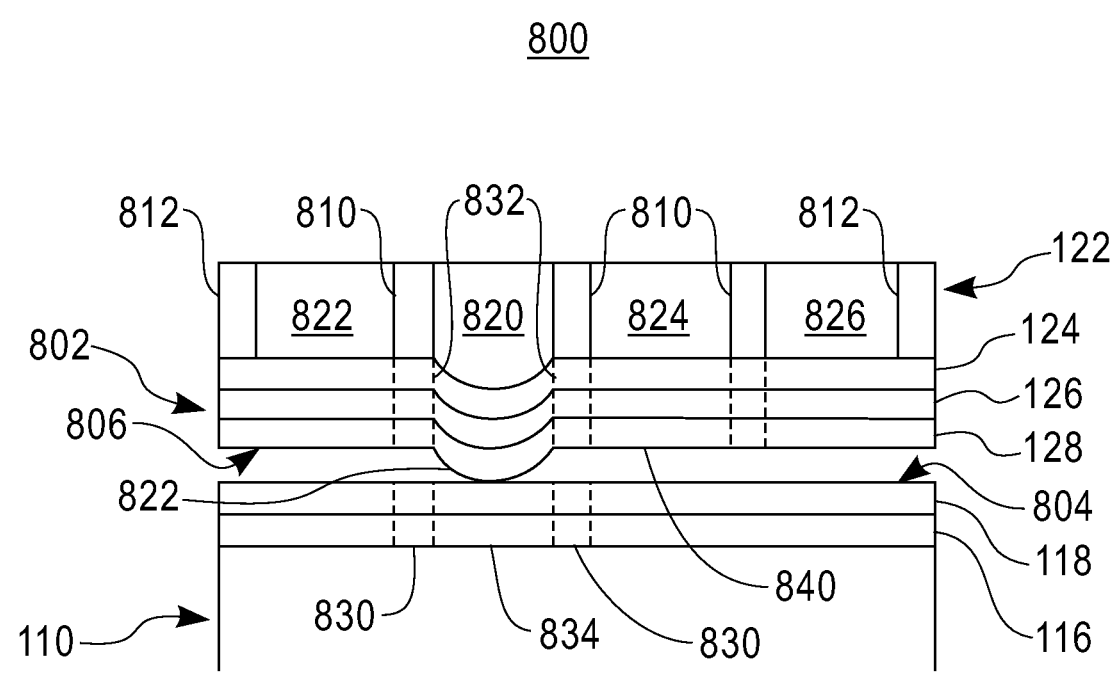
FIG. 8 illustrates a selective die bonding arrangement, in accordance with one embodiment of the present invention.

FIG. 8 illustrates a selective die bonding arrangement 800, in accordance with one embodiment of the present invention. The selective die bonding arrangement 800 shows an acceptor semiconductor wafer 110 with an acceptor device side 804 that is opposite a donor device side 806 of a donor semiconductor wafer 802. As described below, the selective die bonding arrangement 800 allows one or more selected dies on the donor semiconductor wafer 802, such as known good dies known to exist on the donor semiconductor wafer 802, to be individually urged into contact with the acceptor semiconductor wafer 804.

The acceptor semiconductor wafer 110 of the selective die bonding arrangement 800 is shown to include a first bonding layer 118 and a first device layer 116. The acceptor semiconductor wafer 110 is shown to have an acceptor die 834 that is bordered by acceptor kerf areas 830. The various embodiments of the present invention support using acceptor semiconductor wafer 110 that have various detailed structures and other details of the acceptor semiconductor wafer 110 are not shown in this illustration to simplify the description on the selective die bonding arrangement 800.

The donor semiconductor wafer 802 of the selective die bonding arrangement 800 is shown to have layers of the donor semiconductor wafer 802 that correspond to the layers of the second SOI semiconductor wafer 120, described above. The donor semiconductor wafer 802 includes a buried insulator layer 124, a device layer 126 and a bonding film 128. A donor die 822 is shown to exist between donor kerf areas 832.

The donor semiconductor wafer 802 is attached to a supporting structure that includes a support ring 812 and additional support partitions 810. In one embodiment, the additional support partitions 810 of the selective die bonding arrangement 800 are formed on kerf areas, such as the donor kerf areas 832, of the donor semiconductor wafer 802 to form a grid structure defining a number of cavities, such as a first cavity 820, a second cavity 822, a third cavity 824 and a fourth cavity 826. This grid structure is aligned with edges of die across the donor semiconductor wafer and each cavity within the number of cavities circumscribes at least one die on the donor semiconductor structure.

One embodiment of the present invention operates to position the donor semiconductor wafer 802 such that the donor device side 806 of the donor semiconductor wafer 802 is in proximity to and removed from the acceptor device side 804 of the acceptor semiconductor wafer 110. The positioning of the donor semiconductor wafer is able to be achieved by moving one or both of the acceptor semiconductor wafer 110 and the donor semiconductor wafer 802. The positioning of one embodiment causes at least one die, such as the donor die 822, on the donor semiconductor wafer 802 to be aligned with a corresponding at least one acceptor die, such as the acceptor die 834 on the acceptor semiconductor wafer 110.

In one embodiment of the present invention, as illustrated by the selective die bonding arrangement 800, a selected donor die 822 is individually urged into contact with the acceptor die 832. In one embodiment, the donor die 822 is urged into contact with the acceptor die 832 by adjusting an internal pressure within the first cavity 820 that is formed by the support structure formed by the support ring 812 and additional support partitions 810. The selective die bonding arrangement 800 further allows selecting other dies that are on the donor wafer to not be urged into contact with the donor semiconductor wafer. For example, an unselected die 840 that forms the bottom of the second cavity 824 has the internal pressure within its associated cavity, i.e., the second cavity 824 in this case, adjusted so as to cause the unselected die 840 to not be urged into contact with the acceptor wafer 834. Such operations allow known bad dies to not be included in three-dimensional integrated circuits.

In one embodiment, the pressure within the number of cavities, such as the first cavity 820, the second cavity 822, and so forth, is able to be individually adjusted so as to allow for selective urging of portions of the donor semiconductor wafer 802. The individual portions of the donor semiconductor waver 802 that can be selectively urged into contact with a corresponding portion of the acceptor semiconductor wafer in one embodiment of the present invention is defined by the cavities formed by the additional support partitions 810 and/or the support ring 812. The portion that is able to be selectively engaged is able to include one die, a pre-determined number of dies, and/or a field of the donor semiconductor wafer 802 that is any size or configuration.

Figure 5:
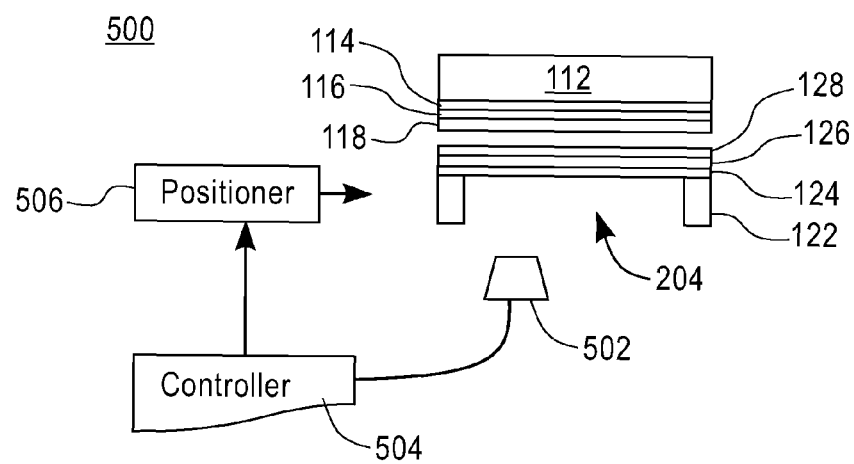
FIG. 5 illustrates a two wafer bonding arrangement, in accordance with one embodiment of the present invention.

FIG. 5 illustrates a two wafer bonding arrangement 500, in accordance with one embodiment of the present invention. The two wafer bonding arrangement 500 shows the first SOI semiconductor wafer 110 and the second SOI semiconductor wafer 120 positioned with their respective device layers facing one another. The first device layer 116 of the first SOI semiconductor wafer 110 is facing the second device layer 126 of the second SOI semiconductor wafer 120. Each of these device layers is further covered by a respective bonding film. The first device layer 116 is covered by the first bonding film 118 and the second device layer is covered by the second bonding film 128.

The two wafer bonding arrangement 500 further includes a positioner 506 that is able to adjust the relative position of the first SOI semiconductor wafer 110 and the second SOI semiconductor wafer 120 so as to ensure their proper relative position prior to bonding these two SOI semiconductor wafers into a three-dimensional semiconductor structure. Positioner 506 is controlled by a controller 504 that determines the current relative positions of the two SOI semiconductor wafers and determines relative position adjustments to be made by positioner 506.

The etched region 204 of one embodiment of the present invention leaves an area of a substrate etched second SOI semiconductor wafer 200 that has only three layers remaining, the second buried insulation layer 124, the second device layer 126 and the second bonding film 128. Some embodiments further leave a layer of crystalline Silicon that has a predetermined thickness 302. In some embodiments, these layers that form one surface of the etched region 204 are sufficiently thin so as to allow optical imaging through those layers. In such embodiments, as described below, aligning the first SOI semiconductor wafer 110 and the second SOI semiconductor wafer 120 for bonding to one another is facilitated by using optical imaging through those layers of the substrate etched second SOI semiconductor wafer.

The relative position of the first SOI semiconductor wafer 110 and the second SOI semiconductor wafer 120 in one embodiment is determined in part by Controller 504 based upon feedback obtained through an optical sensor 502. Optical sensor 502 captures an optical image of the first device layer 116 that is visible through the first bonding film 118, the second bonding film 128, the second device layer 126 and the second buried insulation layer 124. As discussed above, the second bonding film 128, the second device layer 126 and the second buried insulation layer 124 in one embodiment of the present invention form a sufficiently thin membrane that allows an optical image of the first SOI semiconductor wafer 110 to be viewed and captured therethrough.

One embodiment of the present invention aligns and bonds the thin membrane created from the second SOI semiconductor wafer 120 by 1) removing the protective polymer film 206 from the membrane's free surface and completely preparing the underlying bonding oxide for fusion bonding to the first SOI semiconductor wafer 110; 2) cleaning both the substrates of the first SOI semiconductor wafer 110 and the second SOI semiconductor wafer 120 and activating the first bonding oxide film 118 and the second bonding oxide film 128 in a normal manner; and 3) loading the first SOI semiconductor wafer 110 and the second SOI semiconductor wafer 120 on to a modified bonding aligner.

A modified bonding aligner of one embodiment of the present invention has an ability to hold the donor substrate by applying vacuum exclusively to the outer silicon support ring 210 and an ability to control the shape of a membrane by variation in internal pressure on the backside membrane cavity, i.e., within the etched region 204. During the alignment process, the pressure on the back side of the membrane is controlled by adjusting a gas pressure so as to minimize bowing of the membrane. Once aligned, the membrane is controllably "bowed" towards the first SOI semiconductor wafer 110 by increasing the back gas pressure within the etched region 204 to a suitable level to conform the membrane to the topography of the top surface of the first SOI semiconductor wafer 110. The increased pressure further urges the membrane, of the donor semiconductor wafer, into contact with the first device layer 116 of the first SOI semiconductor wafer 110, thereby causing bonding of the donor wafer to the acceptor wafer.

In the case of the waffle grid pattern, the application of pressure can be controlled to ensure first a center region contact and bonding with gradual outward propagation of the applied pressure such that any outgased products are allowed to escape radially out.

Once the membrane, or a selected portion of the membrane, that is formed from the second SOI semiconductor wafer 120 is bonded to the surface of the first SOI semiconductor wafer 110, the combination of the supported membrane and the first SOI semiconductor wafer is annealed in a customary fashion. In embodiments that bond the full wafer of the second SOI semiconductor wafer 120 to the first wafer 110, the bonded combination is annealed and the outer support ring, which is either the un-etched silicon substrate or a separate support structure, is removed via a cutting or etching procedure.

Figure 6:
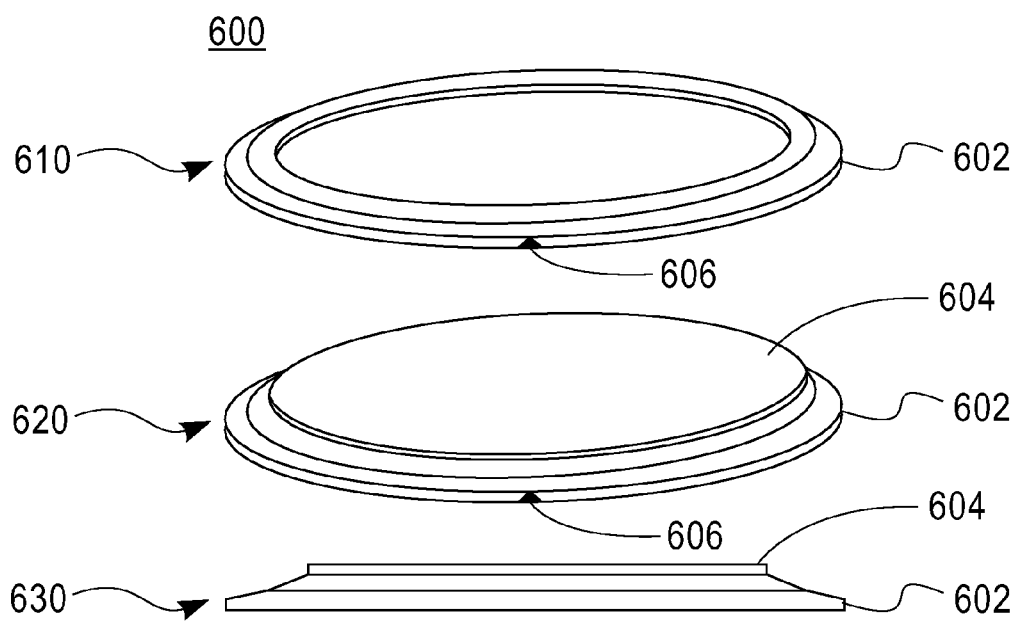
FIG. 6 illustrates a semiconductor device membrane with a separate support structure, in accordance with one embodiment of the present invention.

FIG. 6 illustrates a semiconductor device membrane with a separate support structure 600, in accordance with one embodiment of the present invention. As discussed above, some embodiments of the present invention creates a membrane with a support structure that is formed by leaving crystalline bulk silicon support ridges at selected locations across the membrane. As also discussed above, alternative examples of the support structure include a separate support ring around the edge of a donor wafer. Examples of the separate support ring include a glass/Pyrex support ring that is attached to the circumference of the membrane. The separate support structure is also able to include a waffle grid of additional support partitions for the donor wafer that operate similarly to the above described additional support partitions. The additional support partitions also act to control pattern distortions that may occur during the full wafer membrane formation process.

The semiconductor device membrane with a separate support structure 600 illustrates an unattached separate support structure 610 that includes a separate support structure 602. Embodiments of the present invention that utilize a semiconductor device membrane with a separate support structure 600 are able to include an alignment mark 606 to support accurate positioning of the separate support structure, and the attached donor wafer, during fabrication. The illustrated separate support structure 602 has a substrate pre-alignment notch 606 that supports pre-location of the donor wafer membrane pattern by a locking mechanism for the separate support structure 602.

The semiconductor device membrane, such as a donor wafer, with a separate support structure 600 illustrates an alternative to etching the crystalline silicon substrate and leaving crystalline silicon ridges on the membrane. The semiconductor device membrane with a separate support structure 600 illustrates a result of a process that attaches a separate support structure 602, such as a glass/Pyrex support ring, to the back side of the membrane 604 and then etches away the crystalline silicon substrate to remove the silicon substrate and, in on embodiment, expose the buried oxide layer and thereby creates a donor wafer membrane. An attached separate support ring first view 620 illustrates a donor wafer membrane 604 that is attached to a separate support structure. The illustrated example of a separate support structure 602 includes only a support ring attached to an outer portion of the circumference of the donor wafer membrane 604 by anodic bonding. Similar bonding techniques are used, for example, in the fabrication of x-ray mask substrates. Examples of separate support structures include rings that have thicknesses between, for example, 2 mm and 1 cm. In one embodiment of the present invention, the membrane 604 includes the second buried insulation layer 124, the second device layer 126 and the second bonding film 128. Further embodiments are able to use membranes that further have a layer of crystalline Silicon substrate that has a predetermined thickness 302.

An attached separate support ring side view 630 illustrates a cut-away side view of the structure illustrated in the attached separate support ring first view 620. The separate support structure 602 has the donor wafer membrane 604 attached and is able to be mounted in a fabrication device to position the donor wafer membrane as required in proximity to an acceptor wafer to form a three-dimensional integrated circuit.

Embodiments of the present invention that utilize a semiconductor device membrane with a separate support structure 600 are able to provide structural support while having smaller edge exclusion regions. Such embodiments further simplify masking of the backside of the second SOI semiconductor wafer 120 during the dry and wet etch cycles and support using a method that confines the wet etch chemistry to the backside of the second SOI semiconductor wafer 120 so that polymer protective films are not needed. Embodiments that utilize the semiconductor device membrane with a separate support structure 600 are further able to provide pre-alignment capability by aligning the second SOI semiconductor wafer 120 to the separate support structure 602 and provide a locator mechanism on an alignment tool that would ensure pre alignment to 1 μm.

The separate support structure 602 of one embodiment is further able to include a waffle grid of additional support partitions that are similar to the additional support partitions described above. Such additional support partitions of the separate support structure 602 are able to be designed to align with kerf areas of the membrane and provide support along the kerf areas of the membrane. Utilizing a separate support structure 602 with additional support partitions further allows selective bonding of portions of the membrane, such as individual die, as is described above for the partitioned wafer substrate side of a second SOI semiconductor wafer 400.

Figure 7:
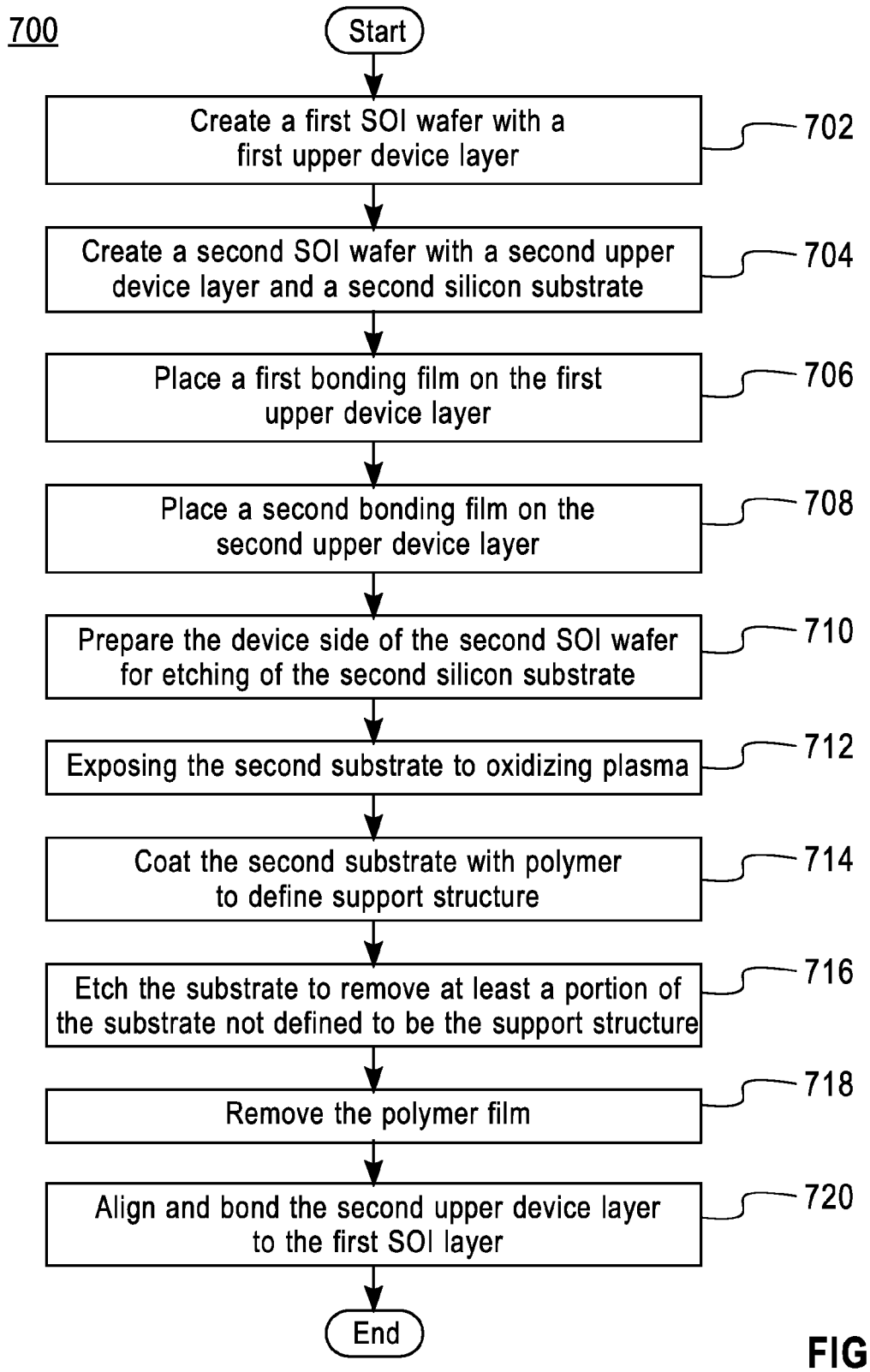
FIG. 7 illustrates a processing flow diagram for a second device membrane bonding process, in accordance with one embodiment of the present invention.

FIG. 7 illustrates a processing flow diagram for a second device membrane bonding process 700, in accordance with one embodiment of the present invention. The second device membrane bonding process 700 performs the above described process of bonding a membrane that includes a second device layer 126 to a first SOI semiconductor wafer 110 in order to create a three-dimensional semiconductor circuit.

The second device membrane bonding process 700 begins by creating, at step 702, a first SOI semiconductor wafer with a first upper device layer and creating, at step 704, a second SOI semiconductor wafer with a second upper device layer and a second silicon substrate, where the second silicon substrate is opposite the second upper device layer. One embodiment uses conventional processes to create the first SOI semiconductor wafer and the second SOI semiconductor wafer.

The second device membrane bonding process 700 continues by placing, at step 706, a first bonding film on the first upper device layer and placing, at step 708, a second bonding film on the second upper device layer.

The second device membrane bonding process 700 continues by preparing, at step 710, the device, or front, side of the second SOI semiconductor wafer 120 for etching of the second silicon substrate. The preparation of the second SOI semiconductor wafer of one embodiment includes coating the device side of the second SOI semiconductor wafer 120 with a polymer film 206 that is known to be resistant to caustic, high temperature TMAH etch chemistries. This polymer film in one embodiment is processed per vender specification to ensure optimum performance.

Once the polymer film that was applied to the front, or device, side of the second wafer is cured, the backside (i.e., the side opposite the front side or the device side) of the second SOI semiconductor wafer 120 is exposed, at step 712, to oxidizing plasma for several minutes to ensure a continuous native $SiO_2$ film.

The second device membrane bonding process 700 of one embodiment that incorporates supporting structures for the device membrane by leaving portions of the second crystalline silicon substrate 122 next coat, at step 714, the backside of the second SOI semiconductor wafer 120 with polymer material that conforms to the supporting structure, such as by forming an outer annular ring 210 that is located close to the edge and bevel surface of the second SOI semiconductor wafer 120. The polymer film that is coated on the backside of the second SOI semiconductor wafer 120 is then annealed per vender specification.

Once the second crystalline silicon substrate is coated, the second device membrane bonding process 700 etches, at step 716, the substrate to remove at least a portion of the crystalline silicon substrate 122. One embodiment of the present invention etches the second silicon substrate 122 by loading it into a plasma etch tool that is specifically designed to etch crystalline silicon at high rates in a directional, or semi directional manor. In one embodiment, an Alcatel Deep Silicon RIE is used. A reactive gas chemistry containing $SF_6$ and $O_2$ is used in this embodiment to etch the silicon at a rate of >60 µm per hour. The etch chuck in this example is configured in such a way that the clamping ring also protects a part of the polymer coating defining the annular ring defining the support ring of the second SOI semiconductor wafer 120. The dry etch of one embodiment is timed to stop with about 100-200 µm of silicon wafer remaining within the etching area 204. A further embodiment of the present invention includes a specifically designed wafer clamp mechanism that provides protection of the entire support ring area during the dry etch.

Once the second SOI semiconductor wafer 120 has been thinned substantially, as described above, the etching continues by exposing the second SOI semiconductor wafer 120 to TMAH at a concentration and temperature known to practitioners of ordinary skill in the art to etch silicon at high rates while being selective to $SiO_2$. Areas that have been protected with the thick polymer are unaffected by this etching process. When the crystalline silicon clears and the buried insulation layer 124 of the second SOI semiconductor wafer 120 is exposed, the second SOI semiconductor wafer 120 is removed from the etch and rinsed with water.

The second device membrane bonding process 700 proceeds by removing, at step 718, the protective polymer film either by exposure to an $O_2$ plasma, or alternatively using a conventional organic stripper.

The second device membrane bonding process 700 continues by aligning and bonding, at step 720, the thin membrane created from the second SOI semiconductor wafer 120 to the first SOI semiconductor wafer 110. The aligning and bonding of one embodiment of the present invention includes 1) removing the protective polymer film 206 from the membrane's free surface and completely preparing the underlying bonding oxide for fusion bonding to the first SOI semiconductor wafer 110; 2) cleaning both the substrates of the first SOI semiconductor wafer 110 and the second SOI semiconductor wafer 120 and activating the first bonding oxide film 118 and the second bonding oxide film 128 in a normal manner; and 3) loading the first SOI semiconductor wafer 110 and the second SOI semiconductor wafer 120 on to a modified bonding aligner.

A modified bonding aligner of one embodiment of the present invention has an ability to hold the donor substrate by applying vacuum exclusively to the outer silicon support ring 210 and an ability to control the shape of a membrane by variation in internal pressure on the backside membrane cavity, i.e., within the etched region 204. During the alignment process, the pressure on the back side of the membrane is controlled by adjusting a gas pressure so as to minimize bowing of the membrane. Once aligned, the membrane is controllably "bowed" towards the first SOI semiconductor wafer 110 by increasing the back gas pressure within the etched region 204 to a suitable level to conform the membrane to the topography of the top surface of the first SOI semiconductor wafer 110.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The invention claimed is:

1. A three-dimensional integrated semiconductor device, comprising:
    at least a portion of an acceptor wafer comprising a first device layer on a top surface, the first device layer having a device side comprising a pattern specific topology; and
    at least a portion of a donor wafer having a second device layer from which a crystalline substrate has been at least mostly removed, the second device layer being bonded to the first device layer by flexing to conform to the pattern specific topology of the device side of the first device layer.

2. The three-dimensional integrated semiconductor device of claim 1, wherein the at least a portion of the acceptor wafer comprises an entire acceptor wafer and the at least a portion of the donor wafer comprises a donor wafer that is a size of an entire semiconductor wafer.

3. The three-dimensional integrated semiconductor device of claim 1, wherein the donor wafer further comprises an insulating layer in contact with the second device layer on a side of the second device layer that is opposite a side of the second device layer that is bonded to the first device layer.

4. The three-dimensional integrated semiconductor device of claim 1, the second device layer having no crystalline substrate.

5. The three-dimensional integrated semiconductor device of claim 1, wherein the at least a portion of the first device layer and the at least a portion of the second device layer each comprise a plurality of semiconductor devices each corresponding to a die formed on the acceptor wafer.

\* \* \* \* \*